United States Patent
Sasaki et al.

(10) Patent No.: US 8,969,103 B2
(45) Date of Patent: Mar. 3, 2015

(54) METHOD FOR MANUFACTURING SILICON CARBIDE SUBSTRATE AND METHOD FOR MANUFACTURING SEMICONDUCTOR DEVICE

(75) Inventors: Makoto Sasaki, Itami (JP); Shin Harada, Osaka (JP); Satomi Itoh, Osaka (JP); Kyoko Okita, Itami (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 91 days.

(21) Appl. No.: 13/807,197

(22) PCT Filed: Jul. 6, 2011

(86) PCT No.: PCT/JP2011/065470
§ 371 (c)(1),
(2), (4) Date: Dec. 27, 2012

(87) PCT Pub. No.: WO2012/014645
PCT Pub. Date: Feb. 2, 2012

(65) Prior Publication Data
US 2013/0109110 A1 May 2, 2013

(30) Foreign Application Priority Data
Jul. 29, 2010 (JP) .................. 2010-170346

(51) Int. Cl.
| H01L 21/00 | (2006.01) |
| H01L 21/66 | (2006.01) |
| H01L 21/04 | (2006.01) |
| H01L 29/04 | (2006.01) |
| H01L 29/66 | (2006.01) |
| H01L 29/78 | (2006.01) |
| H01L 29/16 | (2006.01) |

(52) U.S. Cl.
CPC ........... *H01L 22/12* (2013.01); *H01L 21/049* (2013.01); *H01L 29/045* (2013.01); *H01L 29/66068* (2013.01); *H01L 29/7802* (2013.01); *H01L 29/1608* (2013.01); *Y10S 438/931* (2013.01)
USPC .............................. 438/16; 438/931

(58) Field of Classification Search
USPC ............................. 438/931, 268–270, 14, 16
See application file for complete search history.

(56) References Cited

U.S. PATENT DOCUMENTS

| 6,734,461 B1 * | 5/2004 | Shiomi et al. ............ 257/77 |
| 2009/0134405 A1 | 5/2009 | Ota et al. |
| 2011/0031505 A1 | 2/2011 | Harada et al. |

FOREIGN PATENT DOCUMENTS

| JP | 2002-261275 | 9/2002 |
| JP | 2002-280531 | 9/2002 |
| JP | 2005-340685 | 12/2005 |
| JP | 2007-27630 | 2/2007 |
| JP | 2009-130266 | 6/2009 |
| JP | 2009-164571 | 7/2009 |
| JP | 2010041021 A | 2/2010 |
| WO | 01/18872 | 3/2001 |

* cited by examiner

*Primary Examiner* — Richard Booth
(74) *Attorney, Agent, or Firm* — Drinker Biddle & Reath LLP

(57) ABSTRACT

A silicon carbide substrate is made of silicon carbide. In the silicon carbide substrate, a normal line of one main surface of the silicon carbide substrate and a normal line of a {03-38} plane form an angle of 0.5° or smaller in an orthogonal projection to a plane including a <01-10> direction and a <0001> direction. In this way, there can be provided the silicon carbide substrate allowing for both improvement of channel mobility of a semiconductor device and stable characteristics thereof.

5 Claims, 5 Drawing Sheets

US 8,969,103 B2

METHOD FOR MANUFACTURING SILICON CARBIDE SUBSTRATE AND METHOD FOR MANUFACTURING SEMICONDUCTOR DEVICE

TECHNICAL FIELD

The present invention relates to a silicon carbide substrate, a semiconductor device, and methods for manufacturing them, more particularly, a silicon carbide substrate, a semiconductor device, and methods for manufacturing them, so as to achieve stable characteristics of a semiconductor device including a silicon carbide substrate.

BACKGROUND ART

In recent years, in order to achieve high breakdown voltage, low loss, and utilization of semiconductor devices under a high temperature environment, silicon carbide has begun to be adopted as a material for a semiconductor device. Silicon carbide is a wide band gap semiconductor having a band gap larger than that of silicon, which has been conventionally widely used as a material for semiconductor devices. Hence, by adopting silicon carbide as a material for a semiconductor device, the semiconductor device can have a high breakdown voltage, reduced on-resistance, and the like. Further, the semiconductor device thus adopting silicon carbide as its material has characteristics less deteriorated even under a high temperature environment than those of a semiconductor device adopting silicon as its material, advantageously.

Under such circumstances, various silicon carbide crystals used in manufacturing of semiconductor devices and methods for manufacturing silicon carbide substrates have been considered and various ideas have been proposed (for example, see Japanese Patent Laying-Open No. 2002-280531 (PTL 1)).

CITATION LIST

Patent Literature

PTL 1: Japanese Patent Laying-Open No. 2002-280531

SUMMARY OF INVENTION

Technical Problem

However, semiconductor devices have been required to achieve further improvement of characteristics thereof, such as improvement of channel mobility. In addition to such improvement of characteristics, it is also important to achieve small variation of characteristics among the semiconductor devices.

In view of this, an object of the present invention is to provide a silicon carbide substrate, a semiconductor device, and methods for manufacturing them, so as to achieve both improvement of channel mobility of the semiconductor device and stable characteristics thereof.

Solution to Problem

A silicon carbide substrate according to the present invention is made of silicon carbide, and a normal line of at least one main surface of the silicon carbide substrate and a normal line of a {03-38} plane form an angle of 0.5° or smaller in an orthogonal projection to a plane including a <01-10> direction and a <0001> direction.

The present inventors have conducted detailed research to achieve both improvement of channel mobility of the semiconductor device and stable characteristics thereof. As a result, the present inventors have obtained the following findings and arrived at the present invention.

This will be described specifically as follows. That is, in the case where a semiconductor device is fabricated using a silicon carbide substrate, an epitaxial growth layer is formed on the silicon carbide substrate. Then, an electrode is formed on the epitaxial growth layer. When manufacturing a MOSFET (Metal Oxide Semiconductor Field Effect Transistor) or an IGBT (Insulated Gate Bipolar Transistor), an insulating film such as an oxide film is formed on the epitaxial growth layer. On the insulating film, a gate electrode is formed. In the epitaxial growth layer, a region making contact with the insulating film disposed just below the gate electrode serves as a channel region.

Here, when the at least one main surface of the silicon carbide substrate is adapted to correspond to a plane close to the {03-38} plane of silicon carbide constituting the silicon carbide substrate and the epitaxial growth layer is formed on the main surface so as to fabricate a semiconductor device such as the MOSFET or the IGBT, the channel region is formed to include the plane close to the {03-38} plane. In this way, channel mobility of the semiconductor device can be improved.

Also, the present inventors have found that in the case where a semiconductor device is fabricated using a silicon carbide substrate having a main surface close to the {03-38} plane, characteristics of the semiconductor device tend to greatly vary, and found that the variation results from deviation of the main surface from the {03-38} plane.

More specifically, in the manufacturing of a semiconductor device, an impurity is introduced to generate carriers in the epitaxial growth layer. However, it has been found that even in the case where the introduction of the impurity is normally done, the density of generated carriers is greatly varied only when the plane orientation of the main surface is slightly deviated from the {03-38} plane in the specific plane, specifically, in the plane including the <01-10> direction and the <0001> direction. Moreover, it has been found that when the normal line of the main surface and the normal line of the {03-38} plane are adapted to form an angle of 0.5° or smaller in the orthogonal projection to the plane including the <01-10> direction and the <0001> direction, variation of carrier concentration can be sufficiently suppressed and characteristics of semiconductor devices can be suppressed from being varied.

Thus, in the silicon carbide substrate of the present invention, the normal line of the at least one main surface and the normal line of the {03-38} plane form an angle of 0.5° or smaller in the orthogonal projection to the plane including the <01-10> direction and the <0001> direction, thereby improving channel mobility of a semiconductor device manufactured using the silicon carbide substrate and thereby sufficiently suppressing variation of the carrier concentration. As a result, according to the silicon carbide substrate of the present invention, there can be provided a silicon carbide substrate allowing for both improvement of channel mobility of a semiconductor device and stable characteristics thereof.

In the silicon carbide substrate, the normal line of the one main surface and the normal line of the {03-38} plane may form an angle of 10° or smaller in an orthogonal projection to a plane including a <-2110> direction and the <0001> direction.

Although influence is smaller than that of the deviation in the plane including the <01-10> direction and the <0001> direction, a density of generated carriers is varied due to the deviation in the plane including the <−2110> direction and the <0001> direction. When the deviation in the plane including the <−2110> direction and the <0001> direction is set to be 10° or smaller, the variation of carrier concentration can be further suppressed.

The silicon carbide substrate may have a diameter of 50.8 mm or greater. Accordingly, efficiency is improved in manufacturing a semiconductor device using the silicon carbide substrate.

The silicon carbide substrate may include: a base layer; and a single-crystal silicon carbide layer formed on the base layer, wherein the one main surface is a surface of the single-crystal silicon carbide layer opposite to the base layer.

In this way, an inexpensive base substrate is prepared as the base layer, for example. Specifically, a substrate made of a single-crystal silicon carbide or a polycrystal silicon carbide substrate both having a high defect density, or a base substrate made of a metal is prepared. On such a base layer, substrates made of silicon carbide single crystal excellent in quality are arranged, thereby forming the silicon carbide substrate with relatively inexpensive cost. In particular, it is difficult for a silicon carbide substrate to have a large diameter. Hence, for example, the plurality of single-crystal silicon carbide substrates, which are excellent in quality but have small sizes, are arranged side by side on the base substrate when viewed in a plan view. In this way, an inexpensive silicon carbide substrate having a large diameter can be obtained by fabricating the silicon carbide substrate in which the plurality of single-crystal silicon carbide layers are arranged side by side on the base layer along the main surface of the base layer.

The silicon carbide substrate may further include an epitaxial growth layer formed on the one main surface. This facilitates manufacturing of a semiconductor device using the silicon carbide substrate. It should be noted that the above-described epitaxial growth layer can be utilized as a buffer layer, a breakdown voltage holding layer (drift layer), and the like in the semiconductor device.

A semiconductor device according to the present invention includes: the silicon carbide substrate including the above-described epitaxial growth layer; and an electrode formed on the epitaxial growth layer. According to the semiconductor device of the present invention, a semiconductor device achieving both improvement of channel mobility and stable characteristics can be provided because the silicon carbide substrate of the present invention is included therein.

A method for manufacturing a silicon carbide substrate according to the present invention includes the steps of: preparing an ingot made of silicon carbide; obtaining a substrate from the ingot; and checking whether or not a normal line of at least one main surface of the substrate obtained and a normal line of a {03-38} plane form an angle of 0.5° or smaller in an orthogonal projection to a plane including a <01-10> direction and a <0001> direction.

In this way, the above-described silicon carbide substrate of the present invention can be securely manufactured. It should be noted that the substrate can be obtained from the ingot by, for example, slicing the ingot such that the substrate will have at least one main surface corresponding to a plane close to the {03-38} plane. Further, the angle formed by the normal line of the at least one main surface of the obtained substrate and the normal line of the {03-38} plane can be checked using, for example, an X-ray diffraction method.

The method for manufacturing the silicon carbide substrate may further include the step of checking whether or not the normal line of the one main surface of the substrate obtained and the normal line of the {03-38} plane form an angle of 10° or smaller in an orthogonal projection to a plane including a <−2110> direction and the <0001> direction. In this way, there can be more securely manufactured the silicon carbide substrate capable of suppressing variation of carrier concentration in the semiconductor device. It should be noted that the step of checking whether or not the angle formed by the normal line of the above-described one main surface and the normal line of the {03-38} plane is 0.5° or smaller in the orthogonal projection to the plane including the <01-10> direction and the <0001> direction and the step of checking whether or not the angle is 10° or smaller in the orthogonal projection to the plane including the <−2110> direction and the <0001> direction may be performed separately or simultaneously.

In the method for manufacturing the silicon carbide substrate, the substrate may have a diameter of 50.8 mm or greater. In this way, there can be manufactured a silicon carbide substrate capable of improving efficiency in manufacturing semiconductor devices using the silicon carbide substrate.

The method for manufacturing the silicon carbide substrate may further include the steps of: arranging the substrate obtained, on a base substrate separately prepared; and connecting the base substrate and the substrate to each other.

Accordingly, there can be manufactured the above-described silicon carbide substrate including the base layer and the single-crystal silicon carbide layer formed on the base layer, wherein the above-described one main surface is a surface of the single-crystal silicon carbide layer opposite to the base layer.

The method for manufacturing the silicon carbide substrate may further include the step of forming an epitaxial growth layer on the one main surface. In this way, there can be manufactured the silicon carbide substrate which facilitates manufacturing of a semiconductor device using the silicon carbide substrate.

A method for manufacturing a semiconductor device according to the present invention includes the steps of: preparing a silicon carbide substrate using the above-described method of the present invention for manufacturing the silicon carbide substrate including the step of forming the epitaxial growth layer; and forming an electrode on the epitaxial growth layer. In this way, the semiconductor device of the present invention which has stable characteristics can be manufactured.

It should be noted that a region within 2 mm from the outer circumference of the silicon carbide substrate is usually not used in manufacturing a semiconductor device. Hence, the above-described condition for the angle formed by the normal line of the one main surface and the normal line of the {03-38} plane may be achieved in a region excluding the region within 2 mm from the outer circumference.

Advantageous Effects of Invention

As apparent from the description above, according to the silicon carbide substrate, the semiconductor device, and the methods for manufacturing them in the present invention, a silicon carbide substrate, a semiconductor device, and methods for manufacturing them can be provided to achieve both improvement of channel mobility of the semiconductor device and stable characteristics thereof.

DESCRIPTION OF EMBODIMENTS

Figure 1:
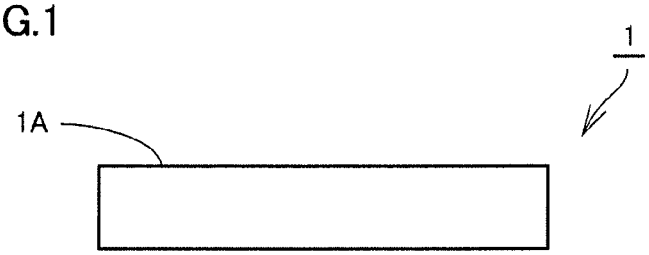
FIG. 1 is a schematic cross sectional view showing a structure of a silicon carbide substrate.

The following describes embodiments of the present invention with reference to figures. It should be noted that in the below-mentioned figures, the same or corresponding portions are given the same reference characters and are not described repeatedly. Further, in the present specification, an individual orientation is represented by [ ], a group orientation is represented by < >, and an individual plane is represented by ( ) and a group plane is represented by { }. In addition, a negative index is supposed to be crystallographically indicated by putting "-" (bar) above a numeral, but is indicated by putting the negative sign before the numeral in the present specification.

(First Embodiment)

First, a first embodiment, which is one embodiment of the present invention, will be described. Referring to FIG. 1, a silicon carbide substrate 1 in the present embodiment is made of silicon carbide. In silicon carbide substrate 1, a normal line of one main surface 1A of silicon carbide substrate 1 and a normal line of a {03-38} plane form an angle of 0.5° or smaller in an orthogonal projection to a plane including a <01-10> direction and a <0001> direction.

Thus, when main surface 1A of silicon carbide substrate 1 is adapted to correspond to a plane close to the {03-38} plane of silicon carbide constituting the silicon carbide substrate and an epitaxial growth layer is formed on main surface 1A so as to fabricate a semiconductor device such as a MOSFET or an IGBT, a channel region thereof is formed to include the plane close to the {03-38} plane. As a result, channel mobility of the semiconductor device can be improved.

Further, when the normal line of main surface 1A and the normal line of the {03-38} plane form an angle of 0.5° or smaller in the orthogonal projection to the plane including the <01-10> direction and the <0001> direction, variation of carrier concentration in semiconductor devices manufactured using this silicon carbide substrate can be sufficiently suppressed. As a result, silicon carbide substrate 1 of the present embodiment is a silicon carbide substrate allowing for both improvement of channel mobility of a semiconductor device and stable characteristics thereof.

Further, in silicon carbide substrate 1 of the present embodiment, the normal line of main surface 1A and the normal line of the {03-38} plane preferably form an angle of 10° or smaller in an orthogonal projection to a plane including a <-2110> direction and the <0001> direction.

As described above, the deviation in the plane including the <01-10> direction and the <0001> direction has a very large influence over the variation (deviation) of carrier concentration. Although influence is smaller than that in the case above, a density of generated carriers is also varied due to deviation in the plane perpendicular to the foregoing plane and including the <-2110> direction and the <0001> direction. When the deviation in the plane including the <-2110> direction and the <0001> direction is set to be 10° or smaller, the variation of carrier concentration can be further suppressed.

Further, silicon carbide substrate 1 of the present embodiment preferably has a diameter of 50.8 mm or greater. By using silicon carbide substrate 1 having such a large diameter, efficiency in manufacturing semiconductor devices can be improved.

Figure 2:
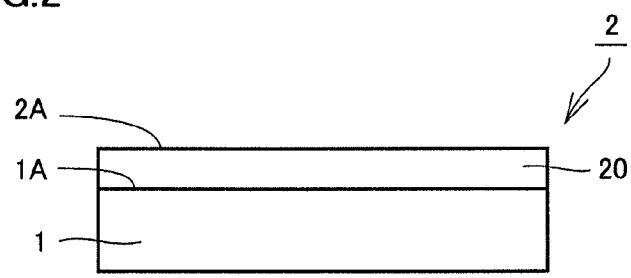
FIG. 2 is a schematic cross sectional view showing a structure of a silicon carbide substrate.

Further, referring to FIG. 2, in the present embodiment, a silicon carbide substrate 2 may be employed which includes an epitaxial growth layer 20 formed on main surface 1A. In this case, also in main surface 2A of epitaxial growth layer 20, in the orthogonal projection to the above-described predetermined plane, the normal line of main surface 2A and the normal line of the {03-38} plane form an angle falling within a range satisfying the above-described condition. As a result, also when a semiconductor device is fabricated using this silicon carbide substrate 2, the variation (deviation) of carrier concentration can be suppressed in the semiconductor device.

Figure 3:
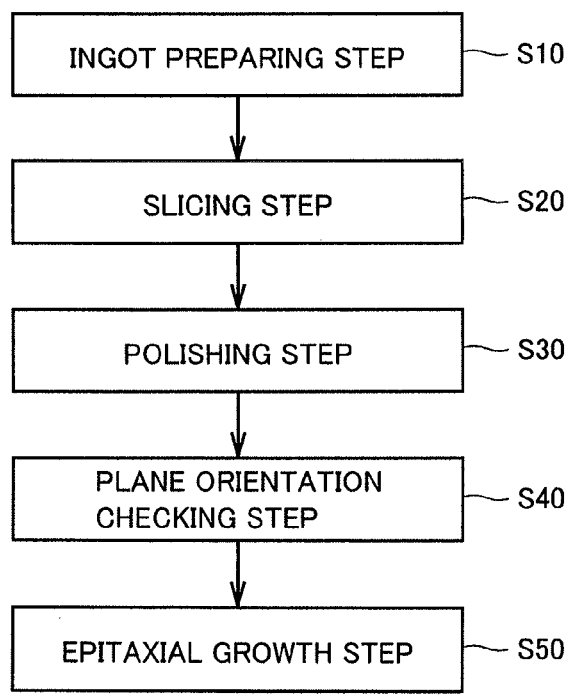
FIG. 3 is a flowchart schematically showing a method for manufacturing the silicon carbide substrate.

The following describes a method for manufacturing the silicon carbide substrate in the present embodiment. Referring to FIG. 3, first, as a step (S10), an ingot preparing step is performed. In this step (S10), an ingot made of silicon carbide is prepared. Specifically, for example, a seed substrate having a main surface corresponding to the (0001) plane is prepared. Then, on the main surface, a silicon carbide single crystal is grown in the [0001] direction, thereby fabricating the ingot made of silicon carbide.

Next, as a step (S20), a slicing step is performed. In this step (S20), the ingot prepared in step (S10) is sliced to obtain a substrate. Specifically, for example, in the case where the seed substrate having its main surface corresponding to the (0001) plane is prepared and is grown in the [0001] direction to prepare the ingot as described above, a substrate having a main surface close to the {03-38} plane is obtained by slicing the ingot along a plane inclined by a predetermined angle relative to the {0001} plane of the ingot. In doing so, by adapting the obtained substrate to have a diameter of 50.8 mm or greater, efficiency can be improved in manufacturing a semiconductor device using the silicon carbide substrate obtained by the method for manufacturing the silicon carbide substrate in the present embodiment.

Next, as a step (S30), a polishing step is performed. In this step (S30), the main surface of the substrate obtained in step (S20) is polished and smoothed.

Next, as a step (S40), a plane orientation checking step is performed. In this step (S40), it is checked whether or not the normal line of at least one main surface of the obtained substrate and the normal line of the {03-38} plane form an angle (deviation angle) of 0.5° or smaller in the orthogonal projection to the plane including the <01-10> direction and the <0001> direction. Specifically, because the {03-38} plane of the silicon carbide single crystal is a plane having an energy level in a forbidden band, the plane orientation of the main surface of the substrate can be checked by an X-ray diffraction method using the (1-102) plane as a diffracting plane, for example. Here, in the case where an X-ray diffraction device targeted for Cu (copper) is employed, the (1-102) plane and the {03-38} plane form an angle of 7.4°. In consideration of this, the above-described deviation angle can be calculated.

In addition, in step (S40), it is preferable to check whether or not the normal line of the main surface of the obtained substrate and the normal line of the {03-38} plane form an angle of 10° or smaller in the orthogonal projection to the plane including the <–2110> direction and the <0001> direction. The checks on the angle formed by the normal line of the main surface of the substrate and the normal line of the {03-38} plane may be performed individually or simultaneously.

As a result of step (S40), if the condition on the angle is not satisfied, the substrate is screened out. If the condition is satisfied, the substrate is regarded as a product. With the above-described procedure, the method for manufacturing the silicon carbide substrate in the present embodiment is completed, thereby obtaining silicon carbide substrate 1 of the present embodiment.

In addition, as a step (S50), an epitaxial growth step may be performed. In this step (S50), epitaxial growth layer 20 is formed on one main surface 1A of silicon carbide substrate 1 obtained in step (S40) (see FIG. 1 and FIG. 2). In this way, silicon carbide substrate 2 including epitaxial growth layer 20 in the present embodiment is obtained.

(Second Embodiment)

Figure 4:
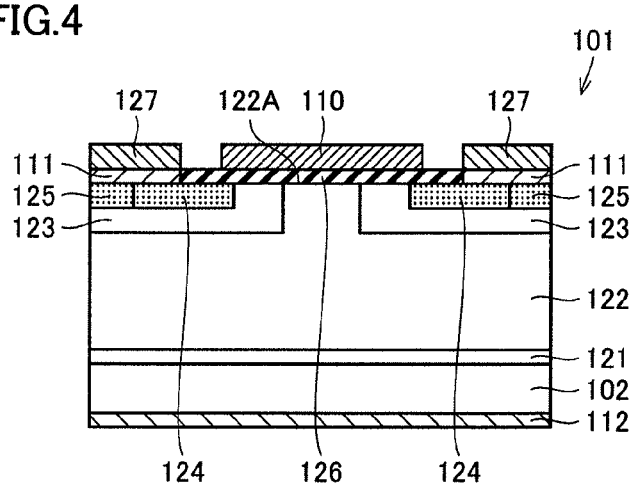
FIG. 4 is a schematic cross sectional view showing a structure of a vertical type MOSFET.

As a second embodiment, the following describes one exemplary semiconductor device fabricated using the above-described silicon carbide substrate of the present invention. Referring to FIG. 4, a semiconductor device 101 according to the present embodiment is a DiMOSFET (Double Implanted MOSFET) of vertical type, and has a substrate 102, a buffer layer 121, a breakdown voltage holding layer 122, p regions 123, n$^+$ regions 124, p$^+$ regions 125, an oxide film 126, source electrodes 111, upper source electrodes 127, a gate electrode 110, and a drain electrode 112 formed on the backside surface of substrate 102. Specifically, buffer layer 121 made of silicon carbide is formed on a surface of substrate 102 made of silicon carbide of n type conductivity. As substrate 102, there is prepared a silicon carbide substrate of the present invention, inclusive of silicon carbide substrate 1 described in the first embodiment. In the case where silicon carbide substrate 1 in the first embodiment is employed, buffer layer 121 is formed on main surface 1A of silicon carbide substrate 1. Buffer layer 121 has n type conductivity, and has a thickness of, for example, 0.5 μm. Further, impurity with n type conductivity in buffer layer 121 has a concentration of, for example, $5 \times 10^{17}$ cm$^{-3}$. Formed on buffer layer 121 is breakdown voltage holding layer 122. Breakdown voltage holding layer 122 is made of silicon carbide of n type conductivity, and has a thickness of 10 μm, for example. Further, breakdown voltage holding layer 122 contains an impurity of n type conductivity at a concentration of, for example, $5 \times 10^{15}$ cm$^{-3}$.

Breakdown voltage holding layer 122 has a surface in which p regions 123 of p type conductivity are formed with a space therebetween. In each of p regions 123, an n$^+$ region 124 is formed at the surface layer of p region 123. Further, at a location adjacent to n$^+$ region 124, a p$^+$ region 125 is formed. An oxide film 126 is formed to extend on n$^+$ region 124 in one p region 123, p region 123, an exposed portion of breakdown voltage holding layer 122 between the two p regions 123, the other p region 123, and n$^+$ region 124 in the other p region 123. On oxide film 126, gate electrode 110 is formed. Further, source electrodes 111 are formed on n$^+$ regions 124 and p$^+$ regions 125. On source electrodes 111, upper source electrodes 127 are formed. Moreover, drain electrode 112 is formed on the backside surface of substrate 102, i.e., the surface opposite to its surface on which buffer layer 121 is formed.

Semiconductor device 101 in the present embodiment employs, as substrate 102, the silicon carbide substrate of the present invention, which is inclusive of silicon carbide substrate 1 described in the first embodiment. Namely, semiconductor device 101 includes: substrate 102 serving as the silicon carbide substrate; buffer layer 121 and breakdown voltage holding layer 122 both serving as epitaxial growth layers formed on and above substrate 102; and source electrodes 111 and gate electrode 110 formed on breakdown voltage holding layer 122. Substrate 102 is the silicon carbide substrate of the present invention.

Here, as described above, the silicon carbide substrate of the present invention is a silicon carbide substrate allowing for both improvement of channel mobility of a semiconductor device and stable characteristics thereof. Hence, semiconductor device 101 is a semiconductor device having high channel mobility and stable characteristics. More specifically, because the main surface of substrate 102 corresponds to a plane close to the {03-38} plane, main surface 122A of breakdown voltage holding layer 122, which is an epitaxial growth layer, corresponds to the plane close to the {03-38} plane. As a result, mobility is high in the channel region (region making contact with oxide film 126 disposed just below gate electrode 110 in each p region 123). Further, because the deviation from the {03-38} plane in the main surface of substrate 102 is appropriately suppressed, variation (deviation) of carrier concentration is sufficiently suppressed in buffer layer 121, breakdown voltage holding layer 122, p region 123, n$^+$ region 124, p$^+$ region 125, and the like. As a result, semiconductor device 101 is a MOSFET having stable characteristics such as a threshold voltage and a breakdown voltage.

Figure 5:
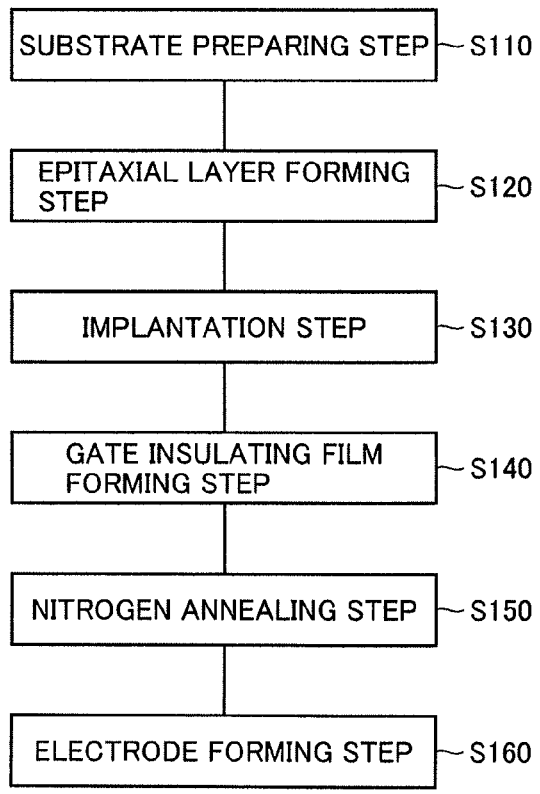
FIG. 5 is a flowchart schematically showing a method for manufacturing the vertical type MOSFET.

The following describes a method for manufacturing semiconductor device 101 shown in FIG. 4, with reference to FIG. 5 to FIG. 9. Referring to FIG. 5, first, a silicon carbide substrate preparing step (S110) is performed. Here, substrate 102 (see FIG. 6) made of silicon carbide is prepared. As substrate 102, there is prepared a silicon carbide substrate of the present invention, inclusive of silicon carbide substrate 1 described in the first embodiment.

As substrate 102 (see FIG. 6), a substrate may be employed which has n type conductivity and has a substrate resistance of 0.02 Ωcm, for example.

Figure 6:
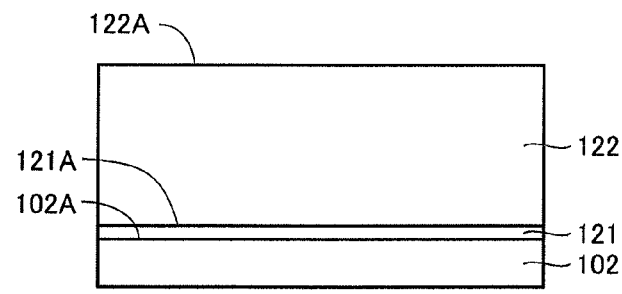
FIG. 6 is a schematic cross sectional view for illustrating the method for manufacturing the vertical type MOSFET.

Next, as shown in FIG. 5, an epitaxial layer forming step (S120) is performed. Specifically, buffer layer 121 is formed on the surface of substrate 102. Buffer layer 121 is formed on main surface 1A (see FIG. 1) of silicon carbide substrate 1 employed as substrate 102. As buffer layer 121, an epitaxial layer is formed which is made of silicon carbide of n type conductivity and has a thickness of 0.5 μm, for example. Buffer layer 121 contains a conductive impurity at a density of, for example, $5 \times 10^{17}$ cm$^{-3}$. Then, on buffer layer 121, breakdown voltage holding layer 122 is formed as shown in FIG. 6. As breakdown voltage holding layer 122, a layer made of silicon carbide of n type conductivity is formed using an epitaxial growth method. Breakdown voltage holding layer 122 can have a thickness of, for example, 10 μm. Further, breakdown voltage holding layer 122 contains an impurity of n type conductivity at a density of, for example, $5 \times 10^{15}$ cm$^{-3}$.

Figure 7:
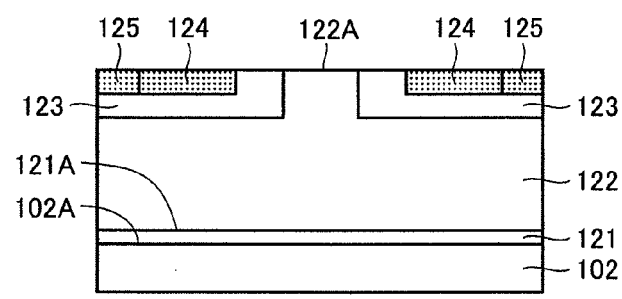
FIG. 7 is a schematic cross sectional view for illustrating the method for manufacturing the vertical type MOSFET.

Next, as shown in FIG. 5, an implantation step (S130) is performed. Specifically, an impurity of p type conductivity is implanted into breakdown voltage holding layer 122 using, as a mask, an oxide film formed through photolithography and etching, thereby forming p regions 123 as shown in FIG. 7. Further, after removing the oxide film thus used, an oxide film having a new pattern is formed through photolithography and etching. Using this oxide film as a mask, a conductive impurity of n type conductivity is implanted into predetermined regions to form n+ regions 124. In a similar way, a conductive impurity of p type conductivity is implanted to form p+ regions 125. As a result, the structure shown in FIG. 7 is obtained.

After such an implantation step, an activation annealing process is performed. This activation annealing process can be performed under conditions that, for example, argon gas is employed as atmospheric gas, heating temperature is set at 1700° C., and heating time is set at 30 minutes. Here, because the deviation from the {03-38} plane in the main surface of substrate 102 is appropriately suppressed, the activation can be sufficiently achieved, thereby obtaining a carrier concentration close to a target value.

Figure 8:
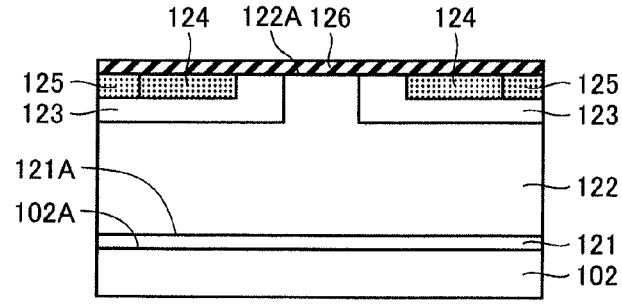
FIG. 8 is a schematic cross sectional view for illustrating the method for manufacturing the vertical type MOSFET.

Next, a gate insulating film forming step (S140) is performed as shown in FIG. 5. Specifically, as shown in FIG. 8, oxide film 126 is formed to cover breakdown voltage holding layer 122, p regions 123, n+ regions 124, and p+ regions 125. As a condition for forming oxide film 126, for example, dry oxidation (thermal oxidation) may be performed. The dry oxidation can be performed under conditions that the heating temperature is set at 1200° C. and the heating time is set at 30 minutes.

Thereafter, a nitrogen annealing step (S150) is performed as shown in FIG. 5. Specifically, an annealing process is performed in atmospheric gas of nitrogen monoxide (NO). Temperature conditions for this annealing process are, for example, as follows: the heating temperature is 1100° C. and the heating time is 120 minutes. As a result, nitrogen atoms are introduced into a vicinity of the interface between oxide film 126 and each of breakdown voltage holding layer 122, p regions 123, n+ regions 124, and p+ regions 125, which are disposed below oxide film 126. Further, after the annealing step using the atmospheric gas of nitrogen monoxide, additional annealing may be performed using argon (Ar) gas, which is an inert gas. Specifically, using the atmospheric gas of argon gas, the additional annealing may be performed under conditions that the heating temperature is set at 1100° C. and the heating time is set at 60 minutes.

Figure 9:
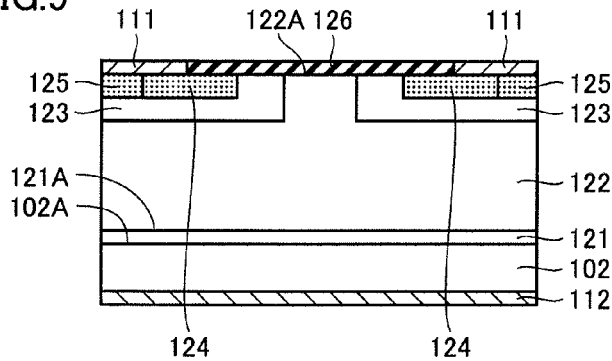
FIG. 9 is a schematic cross sectional view for illustrating the method for manufacturing the vertical type MOSFET.

Next, as shown in FIG. 5, an electrode forming step (S160) is performed. Specifically, a resist film having a pattern is formed on oxide film 126 by means of the photolithography method. Using the resist film as a mask, portions of the oxide film above n+ regions 124 and p+ regions 125 are removed by etching. Thereafter, a conductive film such as a metal is formed on the resist film and formed in openings of oxide film 126 in contact with n+ regions 124 and p+ regions 125. Thereafter, the resist film is removed, thus removing (lifting off) the conductive film's portions located on the resist film. Here, as the conductor, nickel (Ni) can be used, for example. As a result, as shown in FIG. 9, source electrodes 111 can be obtained. It should be noted that on this occasion, heat treatment for alloying is preferably performed. Specifically, using atmospheric gas of argon (Ar) gas, which is an inert gas, the heat treatment (alloying treatment) is performed with the heating temperature being set at 950° C. and the heating time being set at 2 minutes, for example.

Thereafter, on source electrodes 111, upper source electrodes 127 (see FIG. 4) are formed. Further, gate electrode 110 (see FIG. 4) is formed on oxide film 126. Furthermore, drain electrode 112 is formed (see FIG. 4). In this way, semiconductor device 101 shown in FIG. 4 can be obtained.

It should be noted that in the second embodiment, the vertical type MOSFET has been illustrated as one exemplary semiconductor device that can be fabricated using the silicon carbide substrate of the present invention, but the semiconductor device that can be fabricated is not limited to this. For example, another semiconductor device such as an IGBT (Insulated Gate Bipolar Transistor) can be fabricated using the silicon carbide substrate of the present invention.

It should be also noted that the {03-38} plane is preferably the (0-33-8) plane. Accordingly, channel mobility can be further improved in the case where a MOSFET or the like is fabricated using the silicon carbide substrate. Here, the (0001) plane of single-crystal silicon carbide of hexagonal crystal is defined as the silicon plane whereas the (000-1) plane is defined as the carbon plane. In other words, the {03-38} plane is preferably a plane of the carbon plane side.

It should be noted that in consideration of application thereof to a power device, silicon carbide constituting the silicon carbide substrate preferably has a polytype of 4H.

(Third Embodiment)

The following describes a third embodiment, which is another embodiment of the silicon carbide substrate according to the present invention. The silicon carbide substrate in the third embodiment has basically the same configuration and provides basically the same effects as those of the silicon carbide substrate of the first embodiment. However, referring to FIG. 10 and FIG. 1, the silicon carbide substrate of the third embodiment is different from that of the first embodiment in that the silicon carbide substrate of the third embodiment includes a base layer 11 and single-crystal silicon carbide layers 12.

Figure 10:
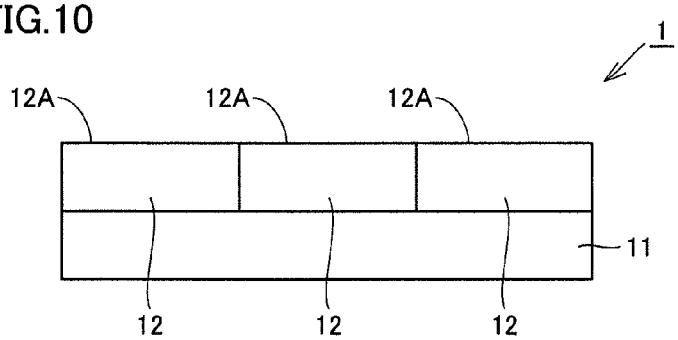
FIG. 10 is a schematic cross sectional view showing a structure of a silicon carbide substrate in a third embodiment.

Specifically, referring to FIG. 10, silicon carbide substrate 1 in the third embodiment includes base layer 11, and single-crystal silicon carbide layers 12 formed on base layer 11. Each of single-crystal silicon carbide layers 12 has a main surface 12A opposite to the base layer 11 side and corresponding to main surface 1A in the first embodiment.

In silicon carbide substrate 1 of the present embodiment, an inexpensive base substrate is employed as base layer 11, such as a substrate made of a single-crystal silicon carbide or a polycrystal silicon carbide substrate both having a high defect density, or a base substrate made of a metal. On such a base layer 11, substrates made of silicon carbide single crystal excellent in quality are arranged to form single-crystal silicon carbide layers 12. Accordingly, silicon carbide substrate 1 of the present embodiment is a silicon carbide substrate obtained with reduced manufacturing cost. Further, silicon carbide substrate 1 of the present embodiment is structured such that the plurality of single-crystal silicon carbide layers 12 are arranged side by side on base layer 11 having a large diameter when viewed in a plan view. As a result, silicon carbide substrate 1 in the present embodiment can be obtained with reduced manufacturing cost, and has a large diameter.

Figure 11:
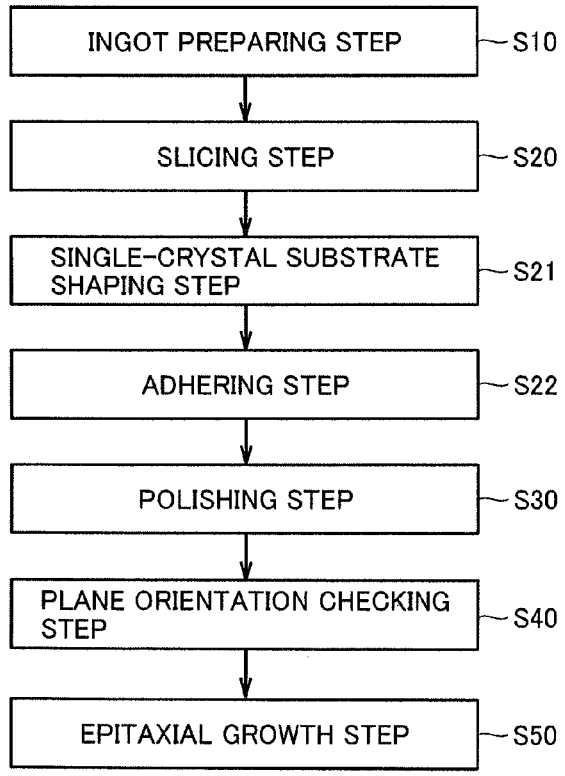
FIG. 11 is a flowchart schematically showing a method for manufacturing the silicon carbide substrate in the third embodiment.

The following describes a method for manufacturing the silicon carbide substrate in the present embodiment. Referring to FIG. 11, in the method for manufacturing the silicon carbide substrate in the present embodiment, first, steps (S10) and (S20) are performed as with the first embodiment. Thereafter, as a step (S21), a single-crystal substrate shaping step is performed. In this step (S21), the substrate obtained as a result of steps (S10) and (S20) is shaped into a shape suitable for forming single-crystal silicon carbide layers 12 shown in FIG. 10. Specifically, for example, by shaping the substrate obtained as a result of steps (S10) and (S20), a plurality of quadrangular substrates are prepared.

Next, as a step (S22), an adhering step is performed. In this step (S22), the plurality of substrates fabricated in step (S21) are arranged side by side in the form of, for example, matrix on the base substrate prepared separately when viewed in a plan view. Thereafter, by performing heating treatment to a predetermined temperature, the substrates fabricated in step (S21) are connected to and combined with the base substrate, thereby obtaining the structure in which the plurality of single-crystal silicon carbide layers 12 are arranged side by side on base layer 11 when viewed in a plan view as shown in FIG. 10.

Thereafter, by performing steps (S30) and (S40) in the same manner as those in the above-described embodiment, silicon carbide substrate 1 in the third embodiment shown in FIG. 10 is completed. Further, as with the first embodiment, an epitaxial growth layer may be formed on single-crystal silicon carbide layer 12 by performing step (S50).

In the third embodiment, it has been illustrated that base layer 11 and single-crystal silicon carbide layers 12 are directly connected to one another by means of the heating, but they may be connected to one another via an intermediate layer such as an adhesive agent.

EXAMPLE 1

An experiment was conducted to inspect a relation between a deviation angle of a main surface of a silicon carbide substrate relative to the {03-38} plane and deviation of carrier concentration in an epitaxial growth layer formed on the silicon carbide substrate.

Figure 12:
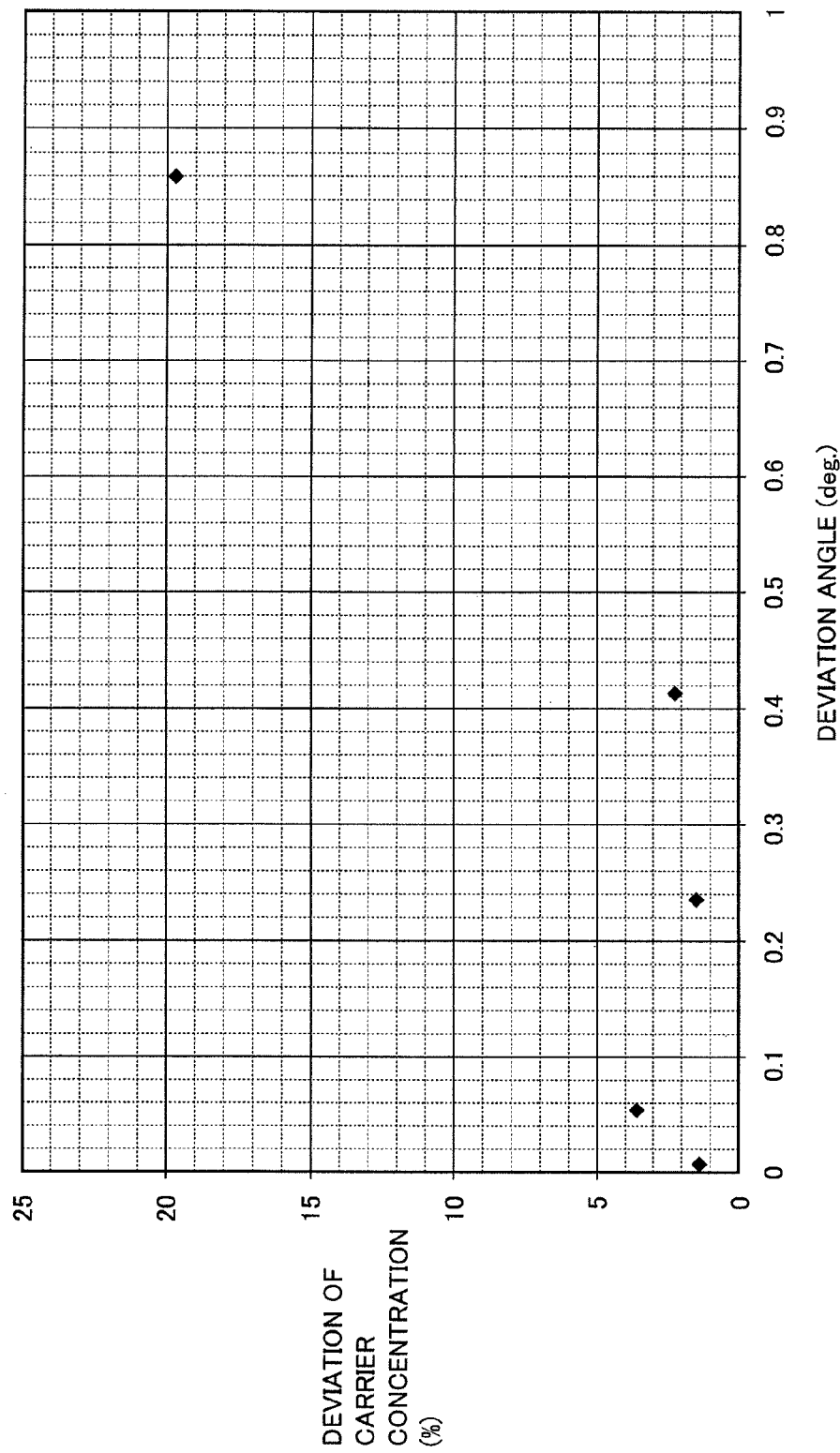
FIG. 12 shows a relation between a deviation angle from the {03-38} plane and deviation of carrier concentration.

First, a plurality of silicon carbide substrates were prepared which have different angles formed by the respective normal lines of the main surfaces thereof and the normal line of the {03-38} plane in an orthogonal projection to a plane including the <01-10> direction and the <0001> direction. Thereafter, on each of the main surfaces, an epitaxial growth layer was formed to have an impurity introduced therein at a carrier concentration of $1\times10^{16}$ cm$^{-3}$, thereby obtaining a sample. Thereafter, the carrier concentration in the epitaxial growth layer of each sample was measured to calculate deviation from the above-described target value ($1\times10^{16}$ cm$^{-3}$). A result of the experiment is shown in FIG. 12. In FIG. 12, the horizontal axis represents the angle (deviation angle) formed by the normal line of the main surface and the normal line of the {03-38} plane in the orthogonal projection to the plane including the <01-10> direction and the <0001> direction. The vertical axis represents a ratio of deviation from the target value ($1\times10^{16}$ cm$^{-3}$) of the carrier concentration (deviation of carrier concentration).

Referring to FIG. 12, as the deviation angle became smaller, the deviation of carrier concentration was abruptly decreased. It was confirmed that by setting the deviation angle at 0.5° or smaller, the deviation of carrier concentration can be sufficiently suppressed.

The embodiments and examples disclosed herein are illustrative and non-restrictive in any respect. The scope of the present invention is defined by the terms of the claims, rather than the embodiments described above, and is intended to include any modifications within the scope and meaning equivalent to the terms of the claims.

INDUSTRIAL APPLICABILITY

The silicon carbide substrate, the semiconductor device, and the methods for manufacturing them in the present invention can be applied to particularly advantageously to a silicon carbide substrate, a semiconductor device, and methods for manufacturing them, each of which is required to achieve stable characteristics of the semiconductor device including the silicon carbide substrate.

REFERENCE SIGNS LIST 1, 2: silicon carbide substrate; 1A, 2A: main surface; 11: base layer; 12: single-crystal silicon carbide layer; 12A: main surface; 20: epitaxial growth layer; 101: semiconductor device; 102: substrate; 110: gate electrode; 111: source electrode; 112: drain electrode; 121: buffer layer; 122: breakdown voltage holding layer; 123: p region; 124: n$^+$ region; 125: p$^+$ region; 126: oxide film; 127: upper source electrode.

The invention claimed is:

1. A method for manufacturing a silicon carbide substrate, comprising the steps of:
    preparing an ingot made of silicon carbide;
    obtaining a substrate from said ingot;
    first checking whether or not a normal line of at least one main surface of said substrate obtained and a normal line of a {03-38} plane form an angle of 0.5° or smaller in an orthogonal projection to a plane including a <01-10>direction and a <0001>direction; and
    second checking whether or not the normal line of said one main surface of said substrate obtained and the normal line of the {03-38} plane form an angle of 10° or smaller in an orthogonal projection to a plane including a <−2110>direction and the <0001>direction, the method further comprising:
    screening out the substrate for production if the step of first checking confirms that the angle is larger than 0.5° and if the step of second checking confirms that the angle is larger than 10°.

2. The method for manufacturing the silicon carbide substrate according to claim 1, wherein said substrate has a diameter of 50.8 mm or greater.

3. The method for manufacturing the silicon carbide substrate according to claim 1, further comprising the steps of:
    arranging said substrate obtained, on a base substrate separately prepared; and
    connecting said base substrate and said substrate to each other.

4. The method for manufacturing the silicon carbide substrate according to claim 1, further comprising the step of forming an epitaxial growth layer on said one main surface.

5. A method for manufacturing a semiconductor device, comprising the steps of:
    preparing a silicon carbide substrate using the method for manufacturing the silicon carbide substrate as recited in claim 4; and
    forming an electrode on said epitaxial growth layer.

* * * * *